United States Patent
Ramaswamy

(10) Patent No.: US 10,937,911 B2
(45) Date of Patent: Mar. 2, 2021

(54) METHOD OF FORMING A TRANSISTOR

(71) Applicant: Micron Technology, Inc., Boise, ID (US)

(72) Inventor: Durai Vishak Nirmal Ramaswamy, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/918,903

(22) Filed: Jul. 1, 2020

(65) Prior Publication Data

US 2020/0335634 A1 Oct. 22, 2020

Related U.S. Application Data

(62) Division of application No. 15/890,147, filed on Feb. 6, 2018, now Pat. No. 10,734,527.

(51) Int. Cl.

| | |
|---|---|
| H01L 29/786 | (2006.01) |
| H01L 29/165 | (2006.01) |
| H01L 29/36 | (2006.01) |
| H01L 21/02 | (2006.01) |
| H01L 29/66 | (2006.01) |
| H01L 21/324 | (2006.01) |
| H01L 29/423 | (2006.01) |

(52) U.S. Cl.
CPC .. *H01L 29/78642* (2013.01); *H01L 21/02532* (2013.01); *H01L 21/02592* (2013.01); *H01L 21/02667* (2013.01); *H01L 21/324* (2013.01); *H01L 29/165* (2013.01); *H01L 29/36* (2013.01); *H01L 29/42392* (2013.01); *H01L 29/66742* (2013.01); *H01L 29/78618* (2013.01); *H01L 29/78684* (2013.01); *H01L 29/78696* (2013.01)

(58) Field of Classification Search
None
See application file for complete search history.

(56) References Cited

U.S. PATENT DOCUMENTS

| | | | |
|---|---|---|---|
| 2009/0045411 A1* | 2/2009 | Lin | H01L 29/66553 257/77 |
| 2009/0272976 A1* | 11/2009 | Brunco | H01L 29/165 257/57 |
| 2013/0233240 A1* | 9/2013 | Cody | C23C 16/0272 117/89 |
| 2016/0300886 A1 | 10/2016 | Oh et al. | |

FOREIGN PATENT DOCUMENTS

WO PCT/US2019/012123 9/2020

* cited by examiner

*Primary Examiner* — Lex H Malsawma
(74) *Attorney, Agent, or Firm* — Wells St. John P.S.

(57) ABSTRACT

A transistor comprises a pair of source/drain regions having a channel there-between. A transistor gate construction is operatively proximate the channel. The channel comprises $Si_{1-y}Ge_y$, where "y" is from 0 to 0.6. At least a portion of each of the source/drain regions comprises $Si_{1-x}Ge_x$, where "x" is from 0.5 to 1. Other embodiments, including methods, are disclosed.

28 Claims, 6 Drawing Sheets

US 10,937,911 B2

METHOD OF FORMING A TRANSISTOR

RELATED PATENT DATA

This patent resulted from a divisional application of U.S. patent application Ser. No. 15/890,147, filed Feb. 6, 2018, entitled "Transistors Comprising A Pair Of Source/Drain Regions Having A Channel There-Between", naming Durai Vishak Nirmal Ramaswamy as inventor, the disclosure of which is incorporated by reference.

TECHNICAL FIELD

Embodiments disclosed herein pertain to transistors and to methods of forming transistors.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, or sense lines) and access lines (which may also be referred to as word lines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates, and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Transistors may be used in circuitry other than memory circuitry.

DETAILED DESCRIPTION OF EXAMPLE EMBODIMENTS

Figure 1:
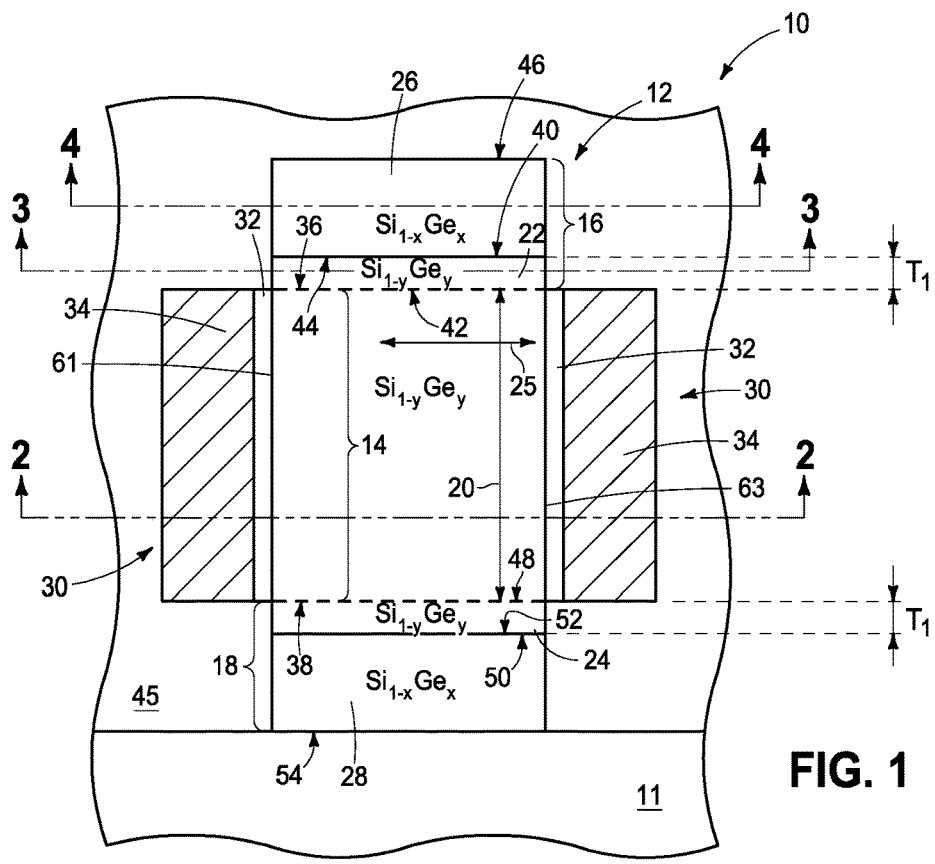
FIG. 1 is a diagrammatic cross-sectional view of a transistor in accordance with an embodiment of the invention, and is taken through line 1-1 in FIGS. 2-4.
Figure 2:
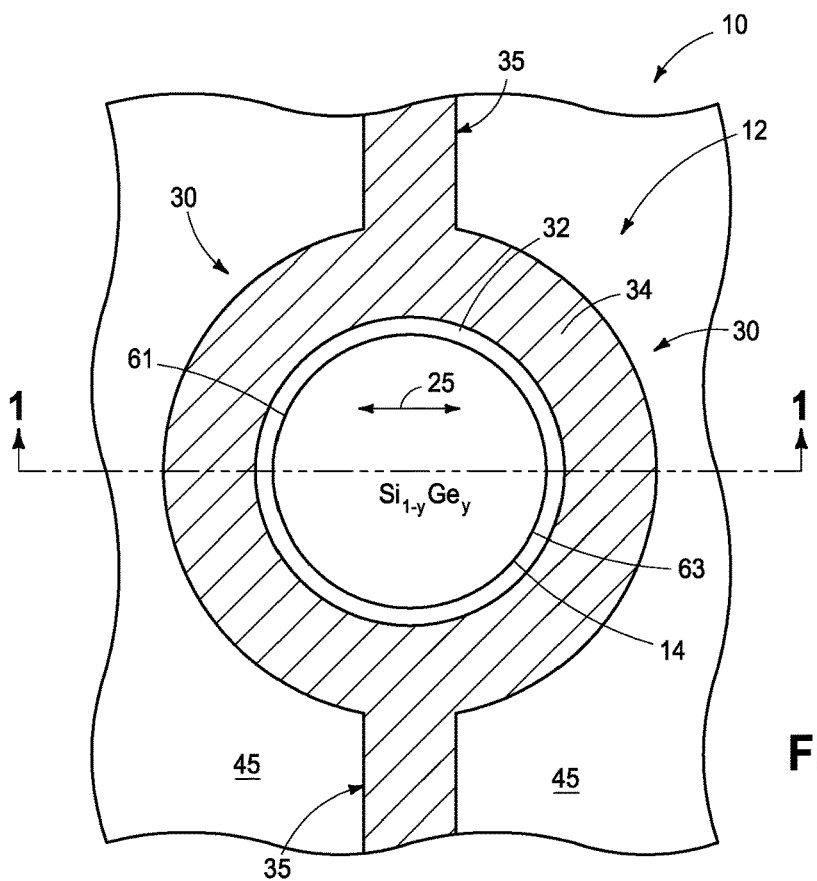
FIG. 2 is a cross-sectional view taken through line 2-2 in FIG. 1.
Figure 3:
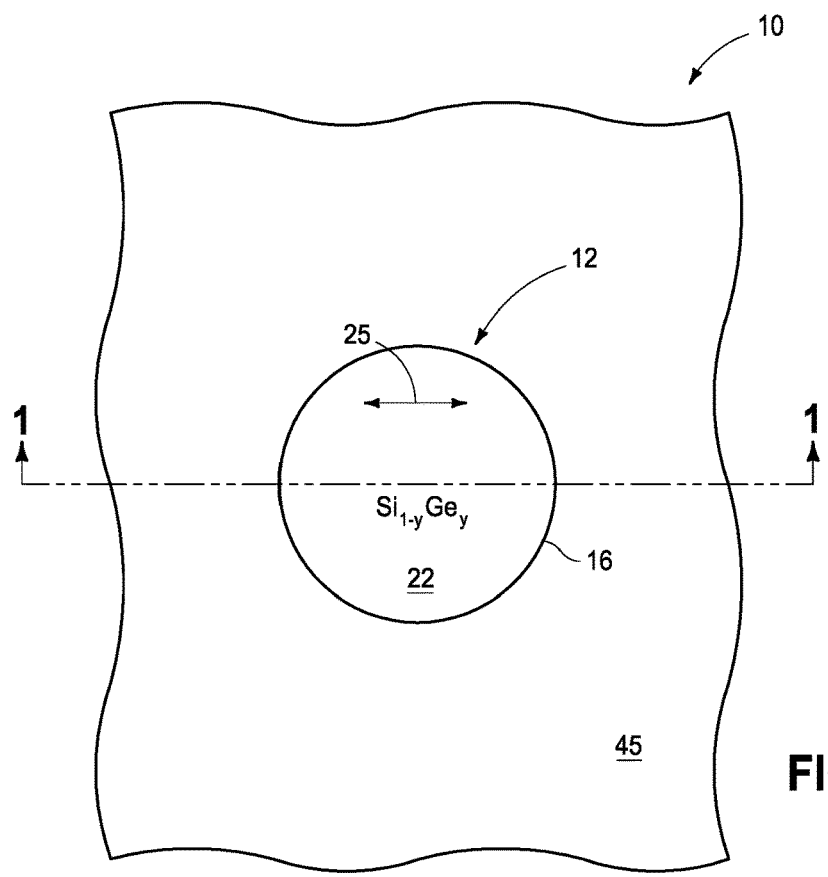
FIG. 3 is a cross-sectional view taken through line 3-3 in FIG. 1.
Figure 4:
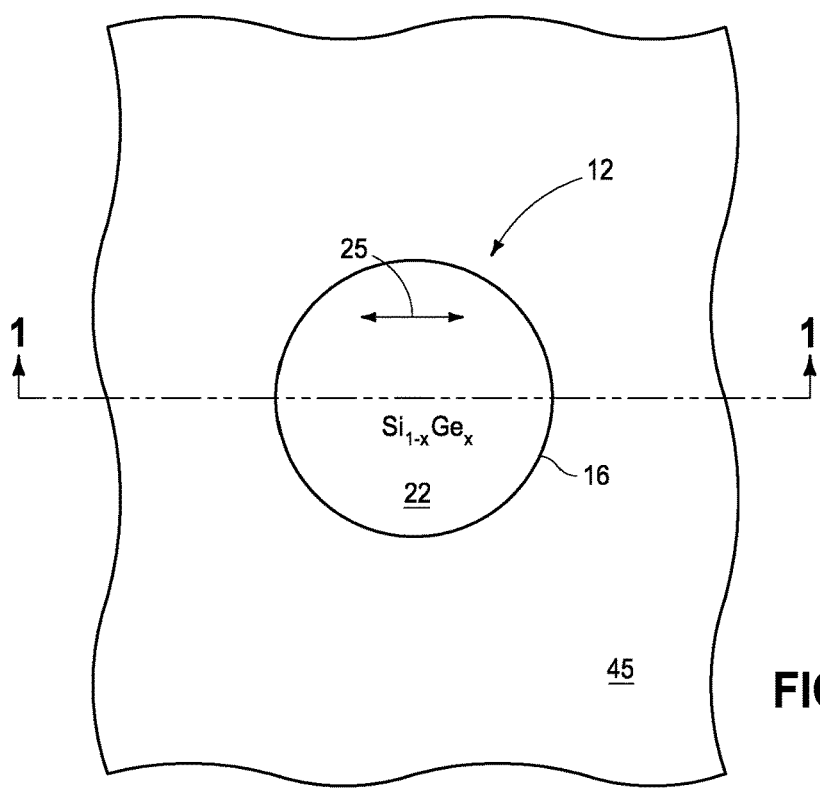
FIG. 4 is a cross-sectional view taken through line 4-4 in FIG. 1.

Embodiments of the invention encompass transistors, arrays of transistors, and devices comprising one or more transistors. First example embodiments are described with reference to FIGS. 1-4. A substrate fragment, construction, or device 10 comprises a base substrate 11 that may include any one or more of conductive/conductor/conducting (i.e., electrically herein), semiconductive/semiconductor/semi-conducting, or insulative/insulator/insulating (i.e., electrically herein) materials. Various materials have been formed elevationally over base substrate 11. Materials may be aside, elevationally inward, and/or elevationally outward of the FIGS. 1-4—depicted materials. For example, other partially or wholly fabricated components of integrated circuitry may be provided somewhere above, about, and/or within base substrate 11. Control and/or other peripheral circuitry for operating components within an array of transistors may also be fabricated, and may or may not be wholly or partially within a transistor array or sub-array. Further, multiple sub-arrays may also be fabricated and operated independently, in tandem, or otherwise relative one another. As used in this document, a "sub-array" may also be considered as an array.

Substrate construction 10 comprises a transistor 12 comprising a pair of source/drain regions 16, 18 having a channel 14 there-between. A transistor gate construction 30 is operatively proximate channel 14. Gate construction 30 comprises conductive gate material 34 (e.g., conductively-doped semiconductor material and/or metal material) and gate insulator 32 (e.g., silicon dioxide, silicon nitride and/or other high k dielectric, ferroelectric material, and/or other programmable material, etc.). Gate material 34 may comprises part of an access line 35 (FIG. 2) that interconnects gates of multiple transistors together in an individual row or column. Regardless, in one embodiment gate construction 30 is over laterally-opposing sides of channel 14 (e.g., sides 61 and 63) in a straight-line vertical cross-section (e.g., the vertical cross-section of FIG. 1 and regardless of whether appearing in portrait, landscape, or any other rotated orientation of the plane of the paper or visual representation upon which FIG. 1 lies). In one embodiment and as shown, gate construction 30 completely encircles channel 14 in all straight-line vertical cross-sections as is inherently shown collectively in viewing FIGS. 1 and 2.

Channel 14 comprises a direction 20 of current flow (i.e., a current-flow direction) there-through between pair of source/drain regions 16 and 18. In one embodiment and as shown, current-flow direction 20 is straight-linear everywhere between source/drain regions 16 and 18 and may be considered as a plane (e.g., the plane of the page upon which FIG. 1 lies between the depicted two opposing gate insulators 32). Channel 14 comprises $Si_{1-y}Ge_y$, where "y" is from 0 to 0.6, and in one embodiment that extends all along current-flow direction 20. Channel 14 may comprise, consist essentially of, or consist of the $Si_{1-y}Ge_y$. An example maximum channel length in current-flow direction 20 is 200 to 2,000 Angstroms.

At least a portion of each source/drain region 16, 18 comprises $Si_{1-x}Ge_x$, where "x" is from 0.5 to 1. For example, source/drain region 16 comprises such a portion 26 and source/drain region 18 comprising such a portion 28. Portions 26 and 28 may comprise, consist essentially of, or consist of the $Si_{1-x}Ge_x$. In one embodiment, each of portions 26 and 28 extends completely through the respective source/drain region orthogonal to current-flow direction 20, such as along an orthogonal direction 25 (e.g., which may be a plane) as shown in FIGS. 1-4. Regardless, in one embodiment and ideally "x" is greater than "y", and in another embodiment "x" equals "y". In one embodiment, "y" is 0. An example maximum dimension of each source/drain region 16, 18 in orthogonal direction 25 is 50 to 2,000 Angstroms.

Each of source/drain regions 16, 18 comprises at least a part thereof comprising a conductivity-increasing dopant therein that is of maximum concentration of such conductivity-increasing dopant within the respective source/drain region 16, 18, for example to render such part to be conductive (e.g., having a maximum dopant concentration of at least $10^{20}$ atoms/cm$^3$). Accordingly, all or only a part of each source/drain region 16, 18 may have such maximum concentration of conductivity-increasing dopant. Regardless, in one embodiment each of portions of 26 and 28 is partially or wholly within the maximum-concentration dopant part. Source/drain regions 16 and 18 may include other doped regions (not shown), for example halo regions, LDD regions, etc.

Channel 14 may be suitably doped with a conductivity-increasing dopant likely of the opposite conductivity-type of the dopant in source/drain regions 16, 18, and for example that is at a maximum concentration in the channel of no greater than $1\times10^{16}$ atoms/cm$^3$. In one embodiment, channel 14 comprises the conductivity-increasing dopant at a maximum concentration in the channel of no greater than $1\times10^{14}$ atoms/cm$^3$, and in embodiment channel 14 comprises no measurable quantity of conductivity-increasing dopant therein.

In one embodiment and as shown, each of source/drain regions 16, 18 comprises $Si_{1-y}Ge_y$ (e.g., a $Si_{1-y}Ge_y$ portion 22 in source/drain region 16 and a $Si_{1-y}Ge_y$ portion 24 in source/drain region 18), and in one embodiment which is directly against the $Si_{1-y}Ge_y$ of channel 14. An example maximum thickness (e.g., $T_1$) in current-flow direction 20 of each portion 22 and 24 is between 0 and 200 Angstroms, with in one embodiment being from 2 to 200 Angstroms. Portions 22 and 24 may be of the same or different thickness(es) relative one another. A dielectric material 45 (e.g., silicon dioxide and/or silicon nitride) is shown above and aside the various operative features in FIGS. 1-4. Others of the above-described and shown materials, regions, and portions may be of any suitable respective thicknesses not particularly material to the invention. Yet, in one embodiment, transistor 12 is a thin-film transistor.

Figure 5:
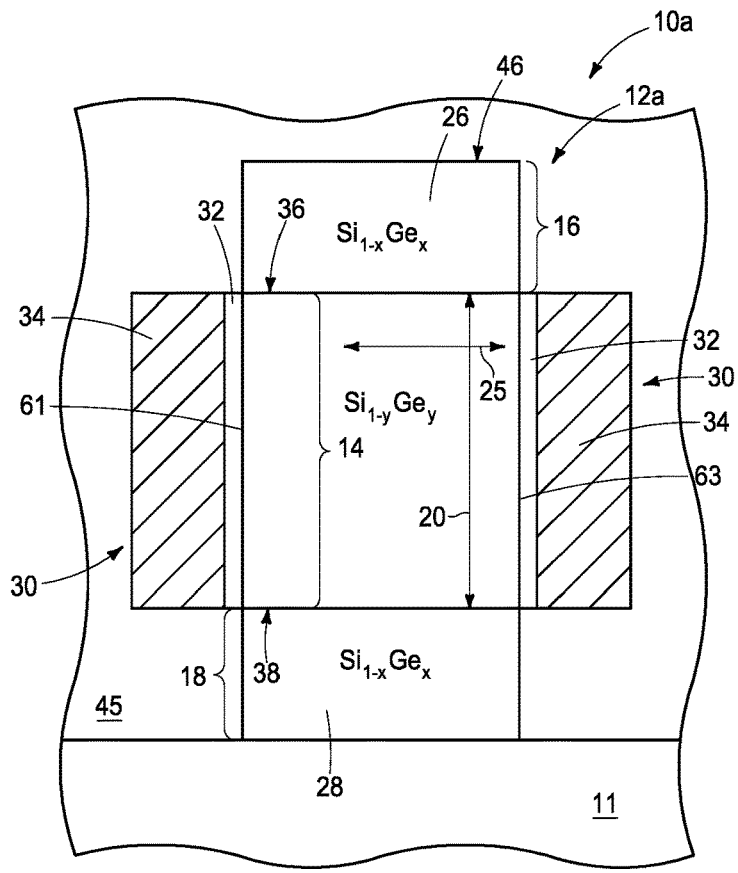
FIG. 5 is a diagrammatic cross-sectional view of a transistor in accordance with an embodiment of the invention.

FIG. 5 shows an alternate example embodiment substrate construction 10a having a transistor 12a wherein source/drain regions 16 and 18 are devoid of $Si_{1-y}Ge_y$ regions 22, 24 (not shown in FIG. 5), respectively. Like numerals from the above-described embodiments have been used where appropriate, with some construction differences being indicated with the suffix "a". Any other attribute(s) or aspect(s) as shown and/or described herein with respect to other embodiments may be used.

In one embodiment, transistor 12 extends elevationally, and in one such embodiment as shown is vertical or within 10° of vertical. Specifically, and in such an example, source/drain region 16 is an upper source/drain region and source/drain region 18 is a lower source/drain region. Channel 14 extends elevationally there-between, and comprises a top 36 (i.e., an uppermost extent) and a bottom 38 (i.e., a lowermost extent). Further, in such an embodiment, portion 22 of upper source/drain region 16 is a lowermost portion thereof and comprises a top 40 and a bottom 42, with bottom 42 being directly against top 36 of channel 14. In one embodiment and as shown, top 36 of channel 14 and bottom 42 of lowermost portion 22 may be planar and elevationally coincident along orthogonal direction 25. Portion 26 is an uppermost portion of upper source/drain region 16 and which comprises a top 46 and a bottom 44. In one embodiment, pair of source/drain regions 16, 18 and channel 14 in combination have an aspect ratio of at least 3:1.

Portion 24 of lower source/drain region 18 comprises an uppermost portion thereof and which comprises a top 48 and a bottom 50 which in one embodiment is directly against bottom 38 of channel 14. In one embodiment and as shown, bottom 38 of channel 14 and top 48 of uppermost portion 24 may be planar and elevationally coincident along orthogonal direction 25. Portion 28 is a lowermost portion of lower source/drain region 18 and which comprises a top 52 and a bottom 54.

Source/drain regions 16, 18 and channel 14 are shown as being circular in horizontal cross-section, although other shapes of the various regions (e.g., elliptical, square, rectangular, triangular, pentagonal, etc.) may be used and all need not be of the same shape relative one another.

As an alternate example, transistor 12 may not be elevationally-extending, for example being horizontally-extending. Specifically, and by way of example, rotating any of FIGS. 1-4 90° to the right or left depicts a horizontally-extending transistor regardless of position or composition of example substrate material 11. Regardless, any other attribute(s) or aspect(s) as shown and/or described herein with respect to other embodiments may be used regardless of vertical, horizontal, or other orientation of the transistor.

An alternate example embodiment transistor 12b of a substrate construction 10b is next described with reference to FIG. 6. Like numerals from the above-described embodiments have been used where appropriate, with some construction differences being indicated with the suffix "b" or with different numerals. An insulator-material region 60 is in each of source/drain regions 16, 18, with insulator-material regions 60 individually being elongated orthogonal to current-flow direction 20 (e.g., along orthogonal direction 25) and being no thicker than 10 Angstroms (e.g., thickness $T_2$) in current-flow direction 20. In one embodiment, each of insulator-material regions 60 is at least 2 Angstroms thick, and in one embodiment is no more than 5 Angstroms thick. Insulator-material regions 60 may be of the same or different thickness(es) relative one another. In one embodiment, each of insulator-material regions 60 comprises $SiO_2$. In one embodiment, each of insulator-material regions 60 comprises C, for example comprising amorphous carbon and/or $Si_xO_yC_z$ (e.g., where "z" is 1% to 10% of the sum of "x", "y", and "z"; where "x" is 25% to 33% of the sum of "x", "y", and "z"; and where "y" is 50% to 66% of the sum of "x", "y", and "z" [each such percent being atomic]). In one embodiment, each of insulator-material regions 60 extends completely through the respective source/drain region 16, 18 orthogonal to current-flow direction 20 (e.g., along direction 25). Each of insulator-material regions 60 may at least in part function as a restrictor of diffusion of conductivity-modifying dopant between (a) and (b), where (a) is each of source/drain regions 16, 18, and (b) is channel 14. Any other attribute(s) or aspect(s) as shown and/or described herein with respect to other embodiments may be used.

Figure 6:
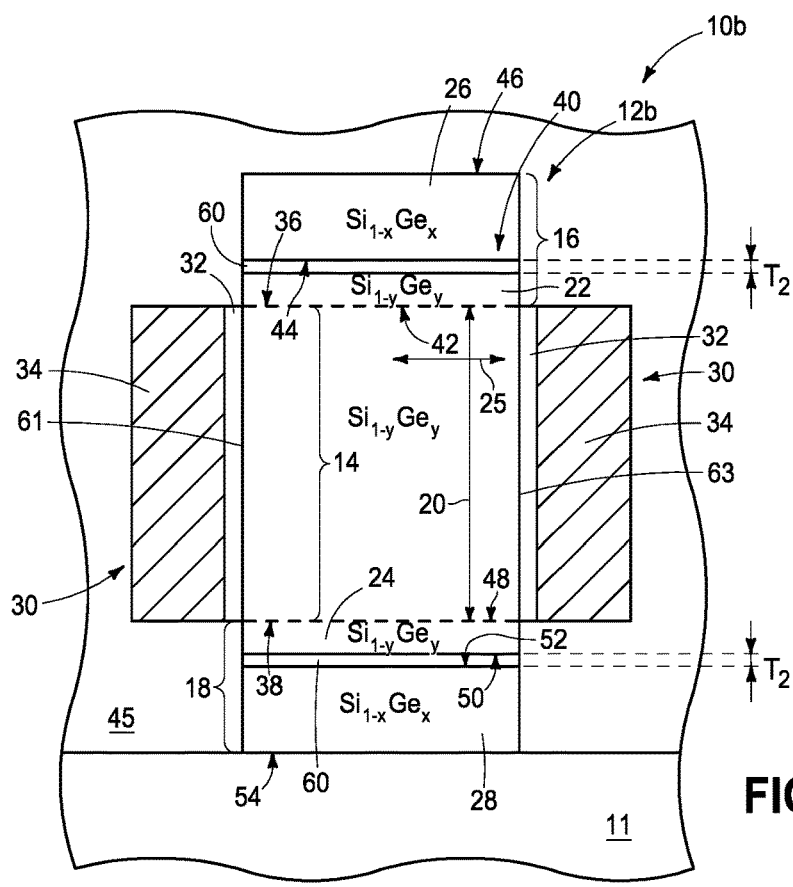
FIG. 6 is a diagrammatic cross-sectional view of a transistor in accordance with an embodiment of the invention.
Figure 7:
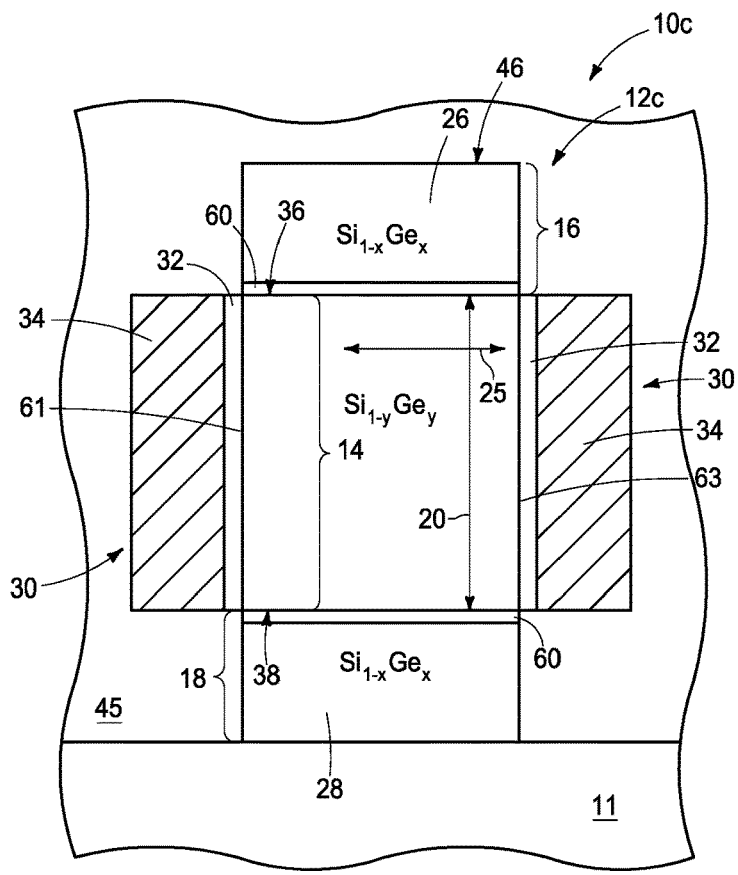
FIG. 7 is a diagrammatic cross-sectional view of a transistor in accordance with an embodiment of the invention.

FIG. 6 shows an example embodiment transistor 12b wherein each of insulator-material regions 60 is not directly against channel 14. Alternately, each of insulator-material regions 60 may be directly against channel 14, for example as is shown in an alternate embodiment transistor 12c with respect to a substrate construction 10c in FIG. 7. Like numerals from the above-described embodiments have been used where appropriate, with some construction differences being indicated with the suffix "c". As a further alternate example, one of insulator-material regions 60 may be directly against channel 14 and the other insulator-material region 60 not be directly against channel 14 (not shown). Regardless, any other attribute(s) or aspect(s) as shown and/or described herein with respect to other embodiments may be used.

Figure 8:
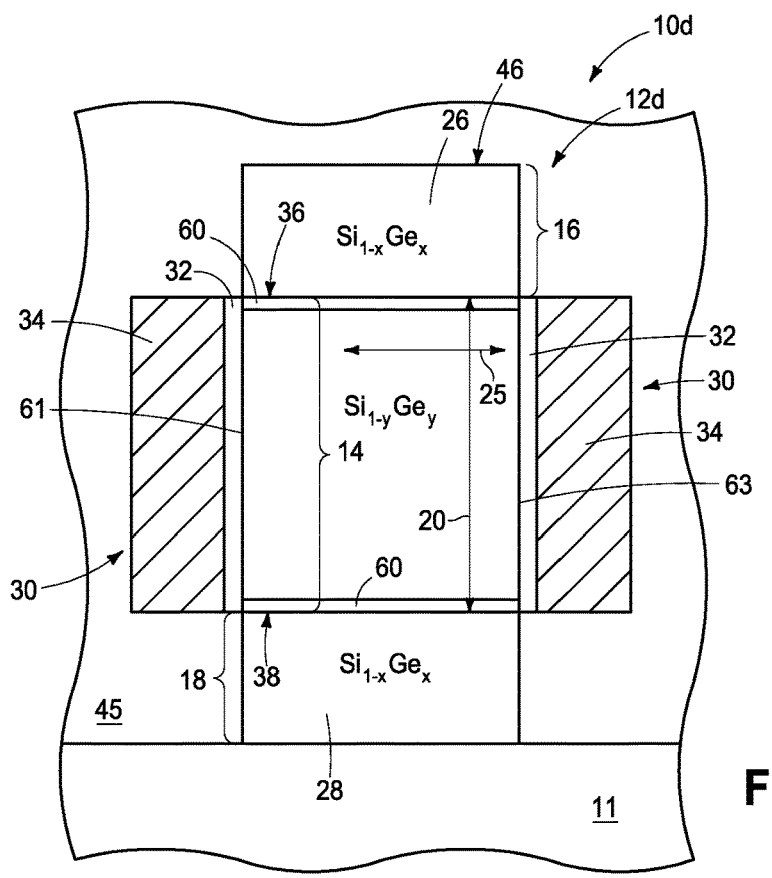
FIG. 8 is a diagrammatic cross-sectional view of a transistor in accordance with an embodiment of the invention.
Figure 9:
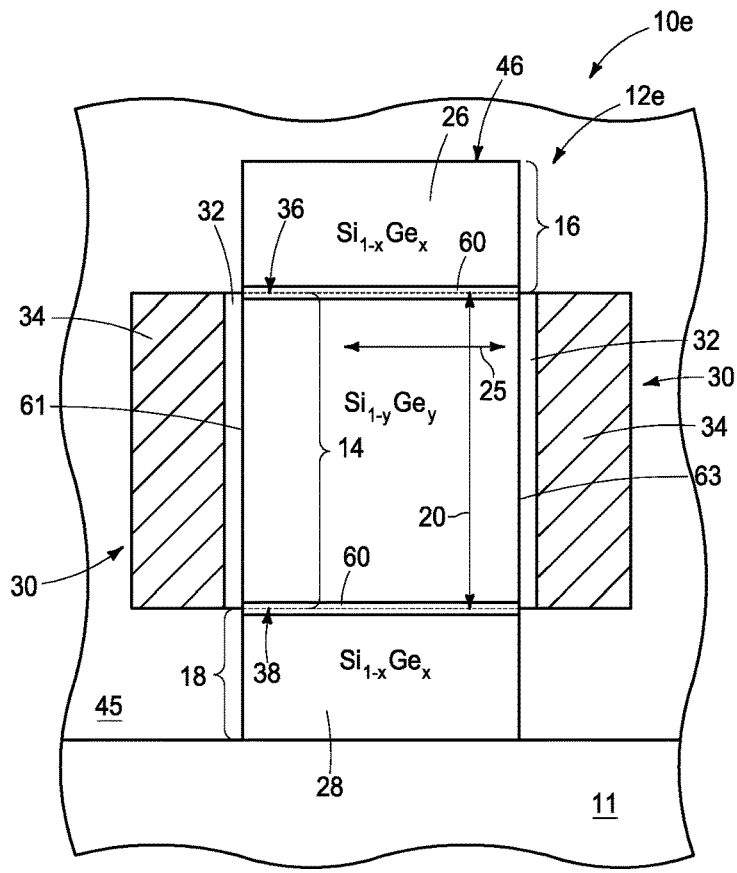
FIG. 9 is a diagrammatic cross-sectional view of a transistor in accordance with an embodiment of the invention.

FIG. 8 shows another example alternate embodiment transistor 12d with respect to a substrate construction 10d. Like numerals from the above-described embodiments have been used where appropriate, with some construction differences being indicated with the suffix "d". Insulator-material regions 60 in transistor 12d are individually in channel 14 and directly against one of the pair of source/drain regions 16, 18. In one embodiment and as shown, each of insulator-material regions 60 extends completely through channel 14 orthogonal to current-flow direction 20 (e.g., along direction 25). Any other attribute(s) or aspect(s) as shown and/or described herein with respect to other embodiments may be used. FIG. 9 shows an alternate example such embodiment transistor 12e with respect to a substrate construction 10e. Like numerals from the above-described embodiments have been used where appropriate, with some construction differences being indicated with the suffix "e". FIG. 9 shows an example wherein each of insulator-material regions 60 is within channel 14 and extends into one of the respective source/drain regions 16, 18. Any other attribute(s) or aspect(s) as shown and/or described herein with respect to other embodiments may be used.

Figure 10:
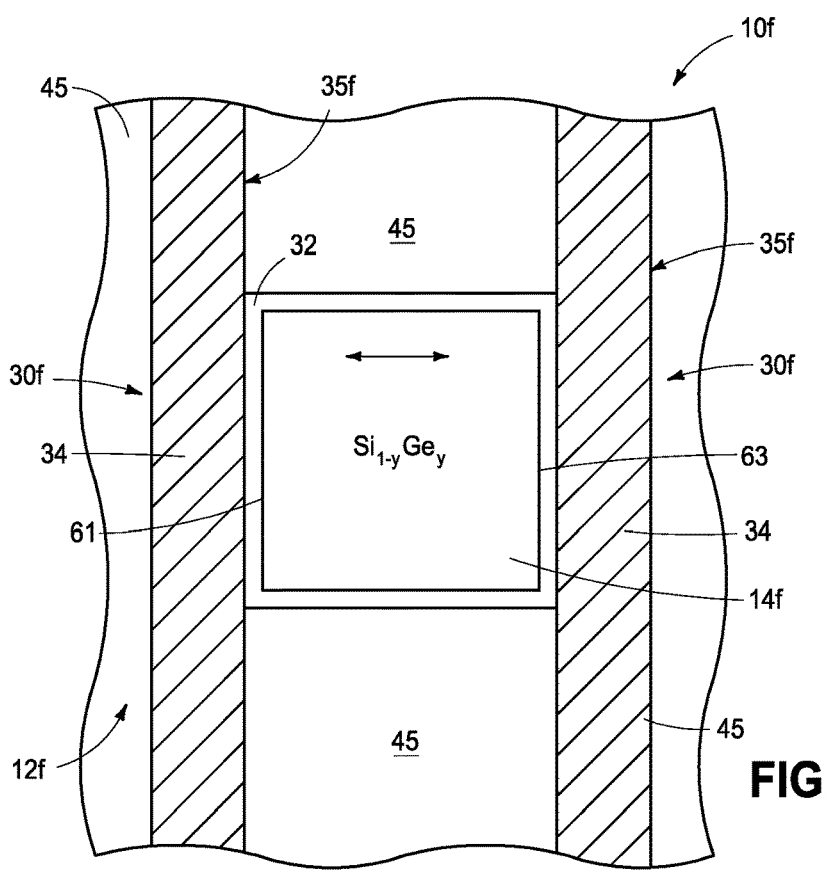
FIG. 10 is a diagrammatic cross-sectional view of a transistor in accordance with an embodiment of the invention.

FIG. 10 shows an alternate example embodiment substrate construction 10f. Like numerals from the above-described embodiments have been used where appropriate, with some construction differences being indicated with the suffix "f". Gate construction 30f of transistor 12f does not completely encircle channel 14f, rather and alternately with gate construction 30f being over only two laterally-opposing sides 61, 63 of channel 14f in straight-line vertical cross-section. Such may be part of access line constructions 35f, and which may or may not be directly electrically coupled together. Any other attribute(s) or aspect(s) as shown and/or described herein with respect to other embodiments may be used.

Figure 11:
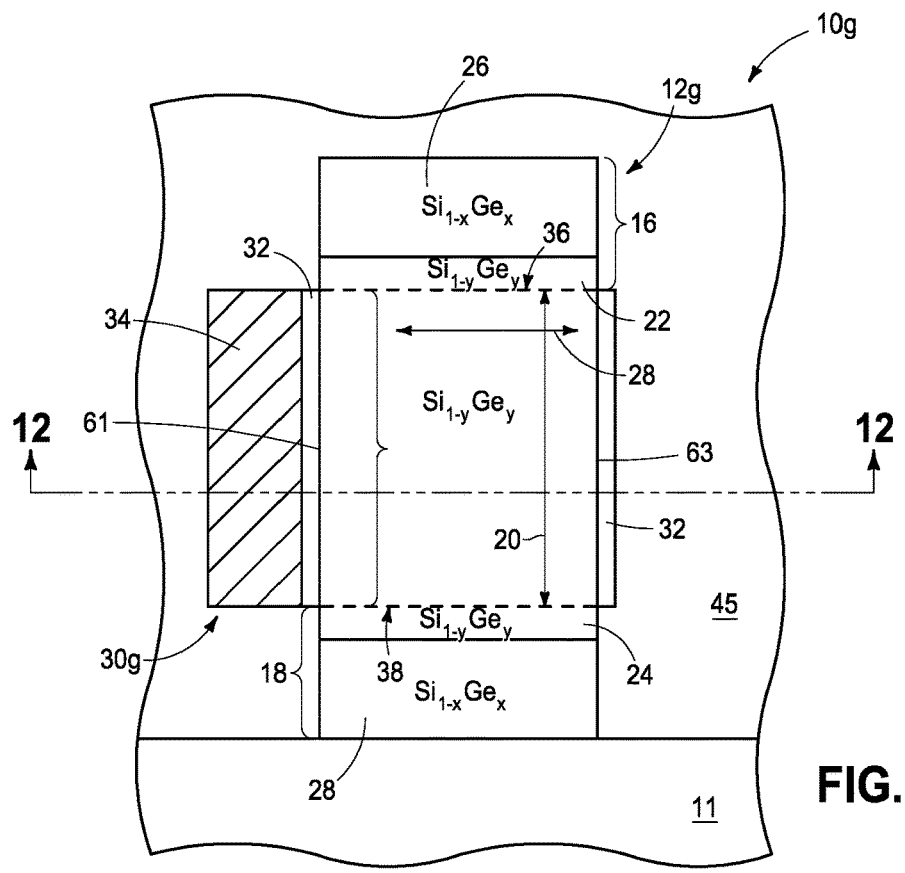
FIG. 11 is a diagrammatic cross-sectional view of a transistor in accordance with an embodiment of the invention, and is taken through line 11-11 in FIG. 12.
Figure 12:
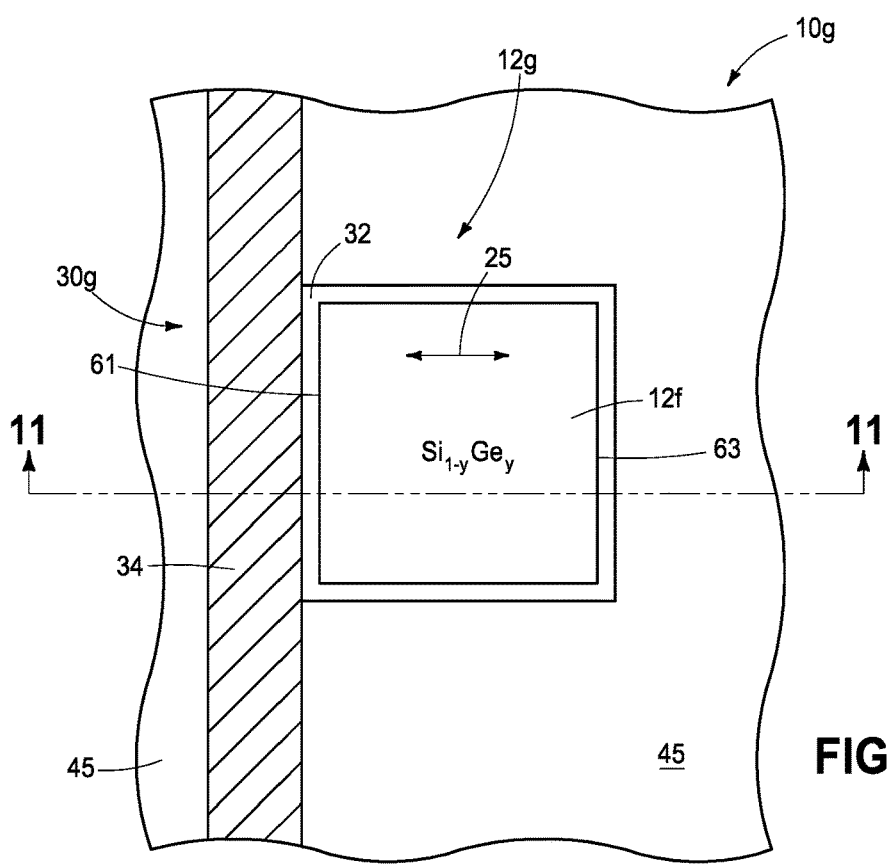
FIG. 12 is a cross-sectional view taken through line 12-12 in FIG. 11.

FIGS. 11 and 12 show yet another alternate example embodiment substrate construction 10g wherein a gate construction 30g of a transistor 12g is over only one lateral side (e.g., side 61) of channel 14f in straight-line vertical cross-section. Like numerals from the above-described embodiments have been used where appropriate, with some construction differences being indicated with the suffix "g". Any other attribute(s) or aspect(s) as shown and/or described herein with respect to other embodiments may be used.

In one embodiment, each of portions 26 and 28 encompasses all of the respective source/drain region 16, 18 (e.g., FIGS. 5 and 8). In one embodiment, each of portions 26 and 28 encompasses only a part of the respective source/drain region 16, 18 (e.g., FIGS. 1, 6, 7, 9, and 11). In one embodiment, each of portions 26 and 28 and the $Si_{1-x}Ge_x$ therein are directly against channel 14 (e.g., FIGS. 5 and 8). In one embodiment, neither of portions 26 nor 28, nor the $Si_{1-x}Ge_x$ therein, is directly against channel 14 (FIGS. 1, 6, 7, 9, and 11). In one such embodiment, each of source/drain regions 16, 18 comprises $Si_{1-y}Ge_y$ and which is directly against $Si_{1-y}Ge_y$ of channel 14 (e.g., FIGS. 1, 6, and 11). In one embodiment, one of portions 26 and 28 and the $Si_{1-x}Ge_x$ therein are directly against the channel and the other of the portions 26 and 28 and the $Si_{1-x}Ge_x$ therein are not directly against the channel (not shown). In one embodiment, the $Si_{1-y}Ge_y$ of channel 14 does not extend all along current-flow direction 20 (e.g., FIGS. 8 and 9). Any other attribute(s) or aspect(s) as shown and/or described herein with respect to other embodiments may be used.

An embodiment of the invention comprises a transistor (e.g., 12b, 12c, 12d, 12e) comprising a pair of source/drain regions (e.g., 16, 18, and regardless of whether having any $Si_{1-x}Ge_x$ therein) having a channel there-between (e.g., 14, and regardless of whether having any $Si_{1-y}Ge_y$). The channel comprises a direction of current flow there-through (e.g., 20) between the pair of source/drain regions. In one embodiment, an insulator-material region (e.g., 60 in FIGS. 6, 7, and 9) is in each of source/drain regions 16, 18, with such insulator-material regions individually being elongated orthogonal to the current-flow direction (e.g., along direction 25) and are no thicker than 10 Angstroms in the current-flow direction. In one embodiment, a pair of insulator-material regions (e.g., 60 in FIGS. 8 and 9) are in the channel and are each elongated orthogonal to the current-flow direction and are each no thicker than 10 Angstroms in the current-flow direction, with the insulator-material regions individually being directly against one of the pair of source/drain regions. Any other attribute(s) or aspect(s) as shown and/or described herein with respect to other embodiments may be used.

Incorporation of germanium as described above in one or both of the channel and source/drain regions may enable reduced activation temperatures (i.e., in the annealing step that is conducted to activate the dopants within the source/drain regions and/or channel). In one embodiment, a method of forming a transistor comprises forming a pair of source/drain regions having a channel there-between. The channel comprises $Si_{1-y}Ge_y$, where "y" is from 0 to 0.6. At least a portion of each source/drain region comprises $Si_{1-x}Ge_x$, where "x" is from 0.5 to 1. Each source/drain region comprises a conductivity-increasing dopant therein. The conductivity-increasing dopant in each of the source/drain regions is activated at a temperature not exceeding 600° C., and in one embodiment not exceeding 550° C. A transistor gate construction is formed operatively proximate the channel either before or after the act of activating the conductivity-increasing dopant in the source/drain regions. In one embodiment, the channel is crystalline when starting the act of activating, and in another embodiment the channel is amorphous when starting the act of activating and becomes crystalline during the activating. In this document, a material or state that is "crystalline" is at least 90% by volume crystalline. In this document, a material or state that is "amorphous" is at least 90% by volume amorphous. Any other attribute with respect to structural embodiments described above may apply with respect to the method embodiments, and vice versa.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45 from exactly horizontal. Further, "extend(ing) elevationally", "elevationally-extending", extend(ing) horizontally, and horizontally-extending with respect to a field effect transistor are with reference to orientation of the transistor's channel length along which current flows in operation between the source/drain regions. For bipolar junction transistors, "extend(ing) elevationally" "elevationally-extending", extend(ing) horizontally, and horizontally-extending, are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

CONCLUSION

In some embodiments, a transistor comprises a pair of source/drain regions having a channel there-between. A transistor gate construction is operatively proximate the channel. The channel comprises $Si_{1-y}Ge_y$, where "y" is from 0 to 0.6. At least a portion of each of the source/drain regions comprises $Si_{1-x}Ge_x$, where "x" is from 0.5 to 1.

In some embodiments, a transistor comprises a pair of source/drain regions having a channel there-between. A transistor gate construction is operatively proximate the channel. The channel comprises a direction of current flow there-through between the pair of source/drain regions. An insulator-material region is in each of the source/drain regions. The insulator-material regions individually are elongated orthogonal to the current-flow direction and are no thicker than 10 Angstroms in the current-flow direction.

In some embodiments, a transistor comprises a pair of source/drain regions having a channel there-between. A transistor gate construction is operatively proximate the channel. The channel comprises a direction of current flow there-through between the pair of source/drain regions. A pair of insulator-material regions is in the channel and that are each elongated orthogonal to the current-flow direction and are each no thicker than 10 Angstroms in the current-flow direction. The insulator-material regions individually are directly against one of the pair of source/drain regions.

In some embodiments, a method of forming a transistor comprises forming a pair of source/drain regions having a channel there-between. The channel comprises $Si_{1-y}Ge_y$, where "y" is from 0 to 0.6. At least a portion of each of the source/drain regions comprises $Si_{1-x}Ge_x$, where "x" is from 0.5 to 1. Each of the source/drain regions comprises a conductivity-increasing dopant therein. The conductivity-increasing dopant in each of the source/drain regions is activated at a temperature not exceeding 600° C. A transistor gate construction is formed operatively proximate the channel.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a transistor, comprising:
    forming a pair of source/drain regions having a channel there-between, the channel comprising $Si_{1-y}Ge_y$, where "y" is from 0 to 0.6, at least a portion of each of the source/drain regions comprising $Si_{1-x}Ge_x$, where "x" is from 0.5 to 1, neither of the portions nor the $Si_{1-x}Ge_x$ therein being directly against the channel, each of the source/drain regions comprising a conductivity-increasing dopant therein, "y" being greater than 0;
    activating the conductivity-increasing dopant in each of the source/drain regions at a temperature not exceeding 600° C.; and
    forming a transistor gate construction operatively proximate the channel.

2. The method of claim 1 wherein the activating is conducted at a temperature not exceeding 550° C.

3. The method of claim 1 wherein the channel is crystalline when starting the activating.

4. The method of claim 1 wherein the channel is amorphous when starting the activating, the channel becoming crystalline during the activating.

5. The method of claim 1 wherein each of the source/drain regions comprises at least a part thereof comprising the conductivity-increasing dopant therein that is of maximum concentration of said conductivity-increasing dopant within the respective source/drain region, each of the portions being within said part.

6. The method of claim 1 wherein the channel comprises a conductivity-increasing dopant therein that is at a maximum concentration in the channel of no greater than $1 \times 10^{14}$ atoms/cm$^3$.

7. The method of claim 1 wherein the channel comprises no measurable quantity of conductivity-increasing dopant therein.

8. The method of claim 1 being elevationally-extending.

9. The method of claim 8 wherein one of the pair of source/drain regions is directly above the other of the pair of source drain regions.

10. The method of claim 8 being vertical or within 10° of vertical.

11. The method of claim 10 wherein the pair of source/drain regions and the channel in combination have an aspect ratio of at least 3:1.

12. The method of claim 1 being a thin-film transistor.

13. The method of claim 1 wherein "x" is greater than "y".

14. The method of claim 1 wherein "x" equals "y".

15. A method of forming a transistor, comprising:
    forming a pair of solid source/drain regions having a channel there-between, the channel comprising $Si_{1-y}Ge_y$, where "y" is from 0 to 0.6, at least a portion of each of the solid source/drain regions comprising $Si_{1-x}Ge_x$, where "x" is from 0.5 to 1, each of the solid source/drain regions comprising a conductivity-increasing dopant therein;
    a pair of insulator-material regions in the channel that are each elongated orthogonal to the current-flow direction, are each extending completely through the channel orthogonal to the current-flow direction, and are each no thicker than 10 Angstroms in the current-flow direction, the insulator-material regions individually being directly against one of the pair of solid source/drain regions;
    activating the conductivity-increasing dopant in each of the solid source/drain regions at a temperature not exceeding 600° C.; and
    forming a transistor gate construction operatively proximate the channel.

16. The method of claim 15 wherein the activating is conducted at a temperature not exceeding 550° C.

17. The method of claim 15 wherein the channel is crystalline when starting the activating.

18. The method of claim 15 wherein the channel is amorphous when starting the activating, the channel becoming crystalline during the activating.

19. The method of claim 15 wherein each of the insulator-material regions is at least 2 Angstroms thick.

20. The method of claim 19 wherein each of the insulator-material regions is no more than 5 Angstroms thick.

21. The method of claim 15 wherein each of the insulator-material regions comprises $SiO_2$.

22. The method of claim 15 wherein each of the insulator-material regions extends into one of the respective solid source/drain regions.

23. The method of claim 22 wherein each of the insulator-material regions extends completely through the respective solid source/drain region orthogonal to the current-flow direction.

24. The method of claim 15 wherein "x" is greater than "y".

25. The method of claim 15 wherein "x" equals "y".

26. The method of claim 15 wherein each of the insulator-material regions comprises carbon.

27. The transistor of claim 26 wherein each of the insulator-material region comprises amorphous carbon.

28. The transistor of claim 26 wherein each of the insulator-material region comprises $Si_xO_yC_z$.

* * * * *